(12) United States Patent
Nomura et al.

(10) Patent No.: US 7,791,067 B2
(45) Date of Patent: Sep. 7, 2010

(54) ELECTRONIC DEVICE AND MANUFACTURING METHOD THEREOF

(75) Inventors: Ryoji Nomura, Kanagawa (JP); Tsunenori Suzuki, Kanagawa (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 410 days.

(21) Appl. No.: 11/659,347

(22) PCT Filed: Aug. 12, 2005

(86) PCT No.: PCT/JP2005/015108

§ 371 (c)(1), (2), (4) Date: Feb. 5, 2007

(87) PCT Pub. No.: WO2006/022192

PCT Pub. Date: Mar. 2, 2006

(65) Prior Publication Data

US 2008/0087880 A1 Apr. 17, 2008

(30) Foreign Application Priority Data

Aug. 23, 2004 (JP) ............... 2004-242869

(51) Int. Cl.
*H01L 35/24* (2006.01)
*H01L 51/00* (2006.01)

(52) U.S. Cl. ............ 257/40; 257/E51.001; 428/690; 525/32.1; 525/420.5

(58) Field of Classification Search ............ 257/40; 428/690; 525/32.1, 420.5; 552/208, 212, 552/213
See application file for complete search history.

(56) References Cited

U.S. PATENT DOCUMENTS

| | | | | |
|---|---|---|---|---|
| 4,720,432 A | * | 1/1988 | VanSlyke et al. | 428/457 |
| 4,769,292 A | * | 9/1988 | Tang et al. | 428/690 |
| 5,518,824 A | | 5/1996 | Funhoff et al. | |
| 5,747,183 A | * | 5/1998 | Shi et al. | 428/690 |
| 5,922,481 A | * | 7/1999 | Etzbach et al. | 428/690 |

(Continued)

FOREIGN PATENT DOCUMENTS

CN 1103230 5/1995

(Continued)

OTHER PUBLICATIONS

International Search Report (Application No. PCT/JP2005/015108; PCT8110) Dated Apr. 4, 2006.

(Continued)

*Primary Examiner*—Kenneth A Parker
*Assistant Examiner*—Anthony Ho
(74) *Attorney, Agent, or Firm*—Nixon Peabody LLP; Jeffrey L. Costellia

(57) ABSTRACT

An object of the invention is to provide an electronic device which can be easily manufactured using a wet method. One of electronic devices according to the invention has a first layer and a second layer. The first layer contains a first compound including a conjugated double bond. Here, the first compound preferably has a molecular weight of 100 to 1000. The second layer contains a second compound having a cyclic structure which is formed by an addition reaction between two molecules of the first compound. Here, a light emitting element or an element such as a transistor can be given as the electronic device.

17 Claims, 10 Drawing Sheets

U.S. PATENT DOCUMENTS

| | | | |
|---|---|---|---|
| 6,559,256 B2 | 5/2003 | Holmes et al. | |
| 6,723,811 B1 | 4/2004 | Holmes et al. | |
| 6,833,283 B2 | 12/2004 | Epstein et al. | |
| 6,916,506 B2 | 7/2005 | Morii et al. | |
| 6,919,415 B2 | 7/2005 | Holmes et al. | |
| 7,105,621 B2 | 9/2006 | Holmes et al. | |
| 2003/0008991 A1 | 1/2003 | Holmes et al. | |
| 2003/0166810 A1 | 9/2003 | Holmes et al. | |
| 2004/0059077 A1 | 3/2004 | Holmes et al. | |
| 2004/0175656 A1* | 9/2004 | Baer et al. | 430/290 |
| 2005/0282983 A1 | 12/2005 | Holmes et al. | |
| 2006/0151782 A1 | 7/2006 | Holmes et al. | |

FOREIGN PATENT DOCUMENTS

| | | |
|---|---|---|
| EP | 1 006 169 A1 | 6/2000 |
| EP | 1 291 406 A1 | 3/2003 |
| EP | 1 715 020 A2 | 10/2006 |
| EP | 1 715 021 A2 | 10/2006 |
| JP | 10-511718 | 11/1998 |
| JP | 2003-163086 | 6/2003 |
| JP | 2003-234522 | 8/2003 |
| JP | 2003-338377 A | 11/2003 |
| WO | WO 96/20253 | 7/1996 |
| WO | WO-2003/013192 | 2/2003 |

OTHER PUBLICATIONS

Written Opinion (Application No. PCT/JP2005/015108; PCT8110) Dated Apr. 4, 2006.

Office Action (Application No. 200580028198.3;PCTCN8110 Dated May 23, 2008).

European Search Report (Application No. 05780424.7; PCTEP08110), dated Nov. 23, 2009.

* cited by examiner

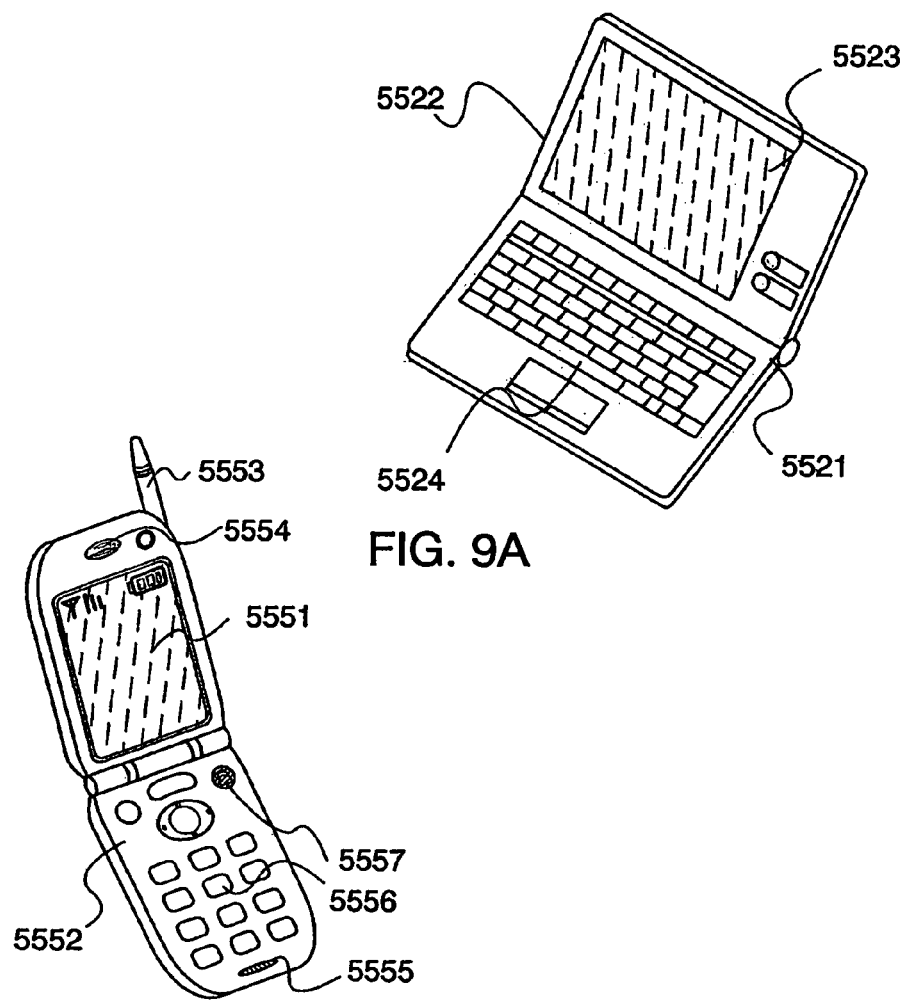
FIG. 9A
FIG. 9B
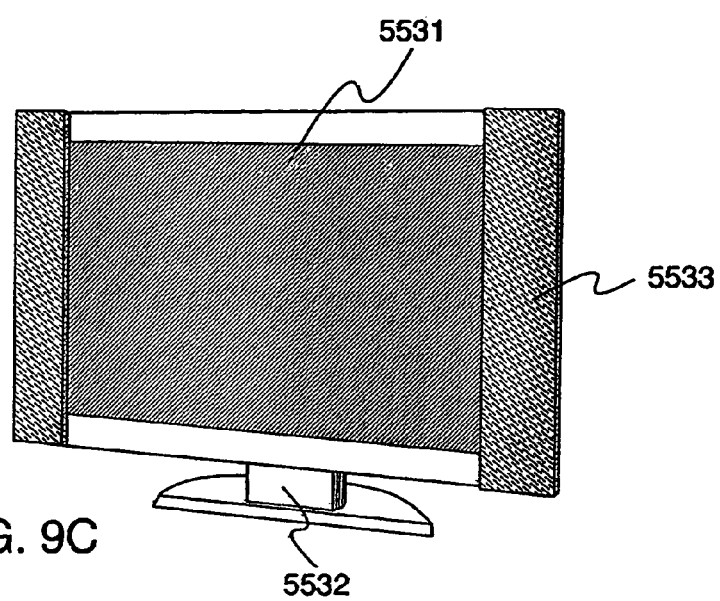
FIG. 9C ately has a molecular weight of 100 to 1000. The

ELECTRONIC DEVICE AND MANUFACTURING METHOD THEREOF

TECHNICAL FIELD

The present invention relates to an electronic device such as a light emitting element or a semiconductor element, and particularly to a structure of a layer included in the electronic device, through which an electric current passes when voltage is applied, and a manufacturing method thereof.

BACKGROUND ART

An inkjet apparatus which has been used as a printing apparatus is also used as an apparatus for forming a wiring or a film these days. With such expansion of applications, the development of materials having performance appropriate for each application has been required.

In the development field of, for example, an electroluminescent element or an organic transistor, a light emitting layer, a transport layer, a semiconductor layer, or the like is formed using a wet method such as an inkjet method or a coating method. As a material for forming these layers, a high molecular weight compound is mainly used.

However, when film formation using a low molecular weight compound as well as a high molecular weight compound by a wet method such as an inkjet method becomes easy, more various elements can be manufactured.

Therefore, a technique for manufacturing an element using a low molecular weight compound as well as a high molecular weight compound is under development. For example, Reference 1 discloses a method for forming a thin film with an inkjet method using a low molecular weight compound by providing a step of forming a self-assembled film (Reference 1: Japanese Patent Laid-Open No. 2003-234522).

In addition, Reference 2 discloses that, when a light emitting layer is formed by a coating method using an organic solvent solution in which a high molecular weight light emitting material is dissolved, there is a problem of invasion of a hole injection layer by the organic solvent (Reference 2: Japanese Patent Laid-Open No. 2003-163086). Further, it also discloses a light emitting element provided with a hole injection layer containing an organic solvent insoluble high molecular weight molecule as its main component in order to solve the problem. According to Reference 2, such a hole injection layer is formed by a method in which a film formed by applying a solution containing an initiator is irradiated with a mercury lamp. However, according to such a method, there is the case where the initiator remains in the film as an impurity.

DISCLOSURE OF INVENTION

It is an object of the invention to provide an electronic device which can be easily manufactured using a wet method.

One of electronic devices according to the invention is an electronic device having a layer containing a compound produced by a [2+2] cycloaddition reaction. Here, a light emitting element or a semiconductor element such as a transistor can be given as the electronic device.

Another electronic device according to the invention has a first layer and a second layer. The first layer contains a first compound including a conjugated double bond. Here, the first compound preferably has a molecular weight of 100 to 1000. The second layer contains a second compound having a cyclic structure which is formed by an addition reaction between two molecules of the first compound. Here, a light emitting element or a semiconductor element such as a transistor can be given as the electronic device.

One of methods for manufacturing an electronic device according to the invention includes a first step and a second step. The first step is a step of forming a first layer containing a compound including a conjugated double bond. Here, the compound preferably has a molecular weight of 100 to 1000. The second step is a step of irradiating the first layer with light so as to cause a [2+2] cycloaddition reaction of the compound contained in the first layer. Here, a light emitting element or a semiconductor element such as a transistor can be given as the electronic device.

Another light emitting element according to the invention is a light emitting element including a layer containing a compound produced by a [2+2] cycloaddition reaction between a first electrode and a second electrode.

Another light emitting element according to the invention is a light emitting element including a first layer and a second layer between a first electrode and a second electrode. The first layer contains a first compound. The second layer contains a second compound. Here, the first compound is a compound including a conjugated double bond. The first compound preferably has a molecular weight of 100 to 1000. The second compound is a compound having a cyclic structure which is formed by an addition reaction between two molecules of the first compound.

Another method for manufacturing a light emitting element according to the invention is a manufacturing method including the step of forming a layer containing a compound having a conjugated double bond and the step of irradiating the layer with light to cause a [2+2] cycloaddition reaction. The compound having a conjugated double bond preferably has a molecular weight of 100 to 1000.

One of semiconductor elements according to the invention is a transistor including a layer containing a compound produced by a [2+2] cycloaddition reaction between a first semiconductor layer and a second semiconductor layer.

Another semiconductor element according to the invention is a transistor including a first semiconductor layer, a second semiconductor layer, and a third semiconductor layer. The first semiconductor layer contains a first compound. The second semiconductor layer contains a second compound. Here, the first compound is a compound including a conjugated double bond. The first compound preferably has a molecular weight of 100 to 1000. The second compound is a compound having a cyclic structure which is formed by an addition reaction between two molecules of the first compound. Further, the polarity of a preferentially transported carrier differs between the first semiconductor layer and the third semiconductor layer.

One of methods for manufacturing a semiconductor element according to the invention is a manufacturing method including the step of forming a layer containing a compound having a conjugated double bond and the step of irradiating the layer with light to cause a [2+2] cycloaddition reaction. The compound having a conjugated double bond preferably has a molecular weight of 100 to 1000.

According to the invention, an electronic device such as a light emitting element or a semiconductor element, having a laminated structure of a plurality of layers formed using a wet method can be easily manufactured. Further, an electronic device can be easily manufactured at low cost by particularly using a drawing method among a wet method. Moreover, according to the invention, an electronic device with low impurity content can be easily manufactured.

In addition, a low-cost and inexpensive light emitting device or semiconductor device, or an electronic device which becomes low-cost and inexpensive by mounting the same can be obtained.

BRIEF DESCRIPTION OF DRAWINGS

FIGS. 9A to 9C show electronic devices to which the present invention is applied.

BEST MODE FOR CARRYING OUT THE INVENTION

Hereinafter, embodiment modes of the present invention will be explained. However, the invention can be carried out in many different modes. As is easily known to a person skilled in the art, the mode and the detail of the invention can be variously changed without departing from the spirit and the scope of the present invention. Thus, the present invention is not interpreted while limiting to the following description of the embodiment mode.

Embodiment Mode 1

Figure 1:
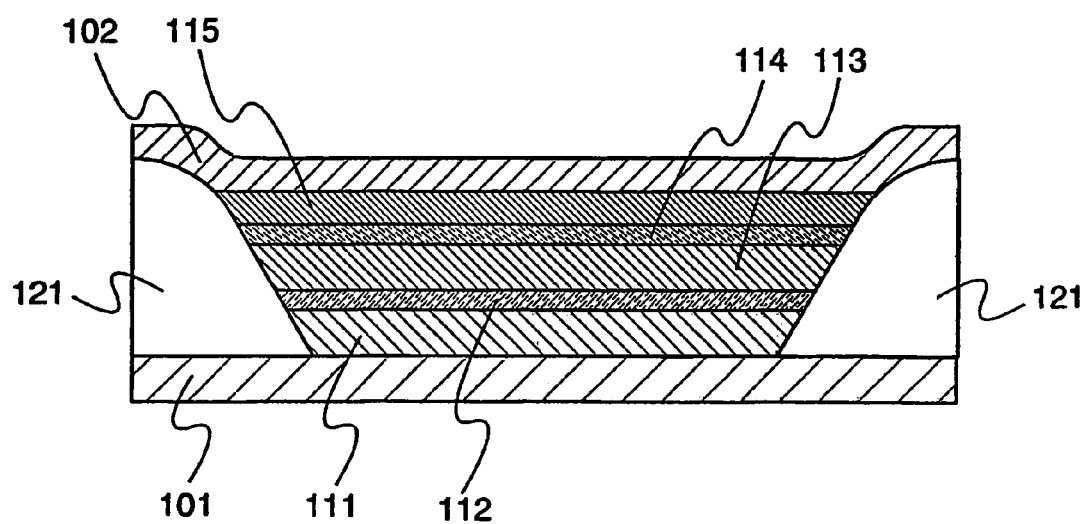
FIG. 1 shows a structure of a light emitting device of the present invention.
Figure 2A:
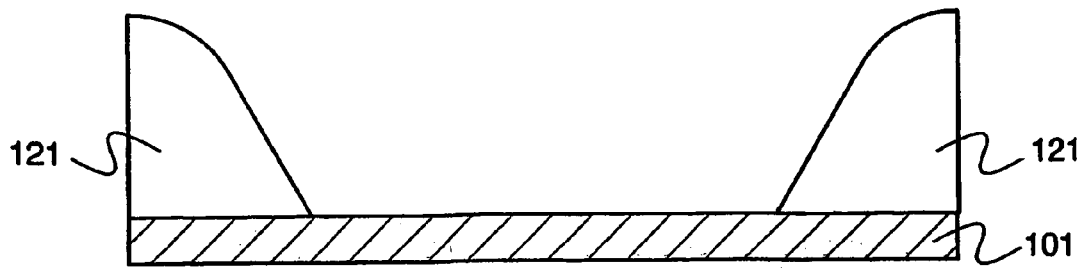
FIGS. 2A to 2D show a method for manufacturing a light emitting device of the present invention.
Figure 2B:
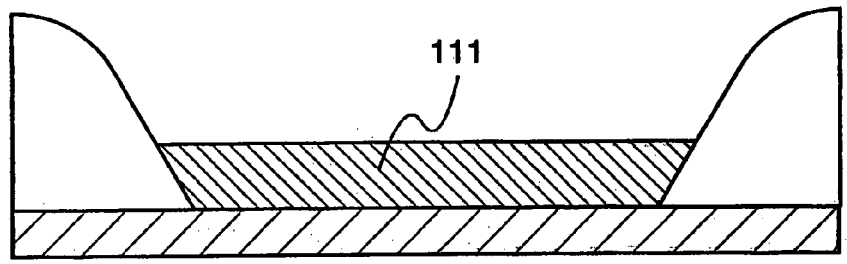
Figure 2C:
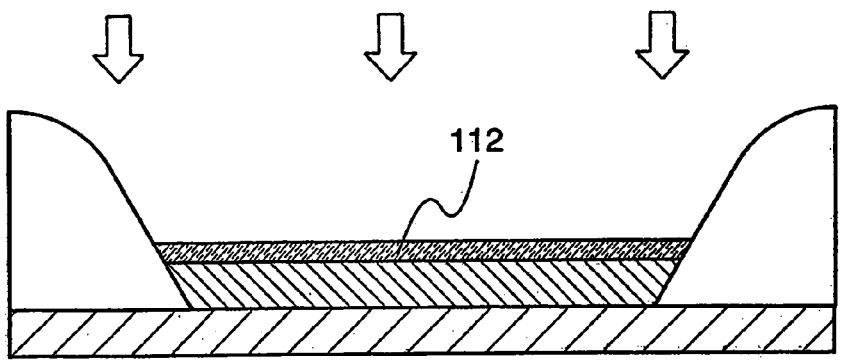
Figure 2D:
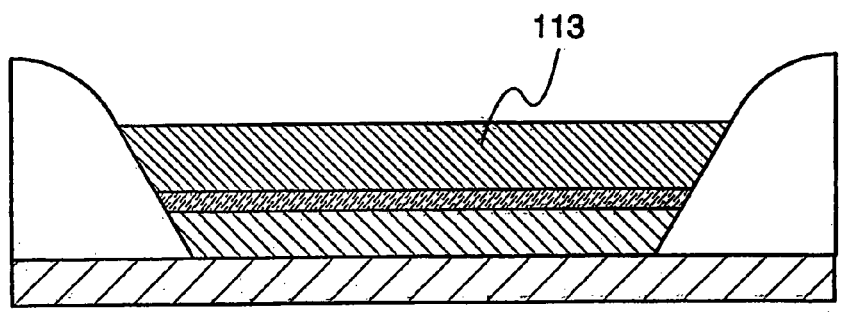
Figure 3A:
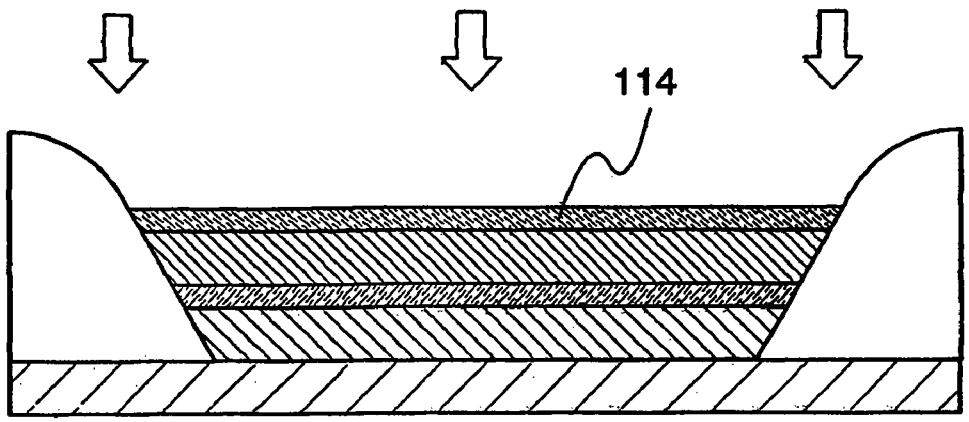
FIGS. 3A to 3C show a method for manufacturing a light emitting device of the present invention.
Figure 3B:
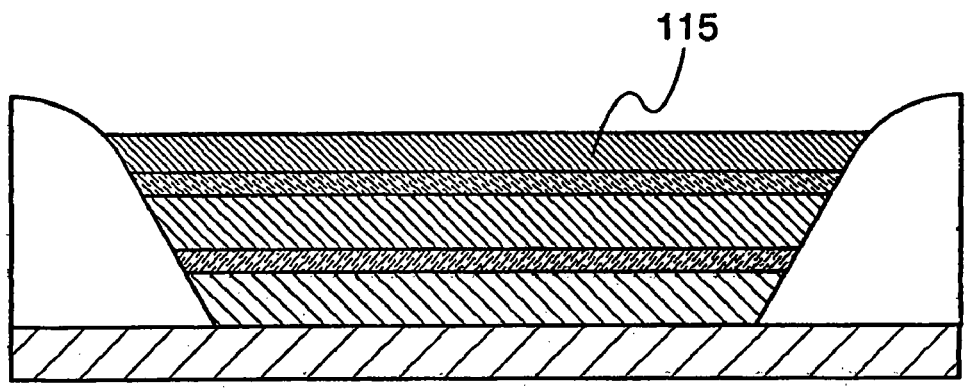
Figure 3C:
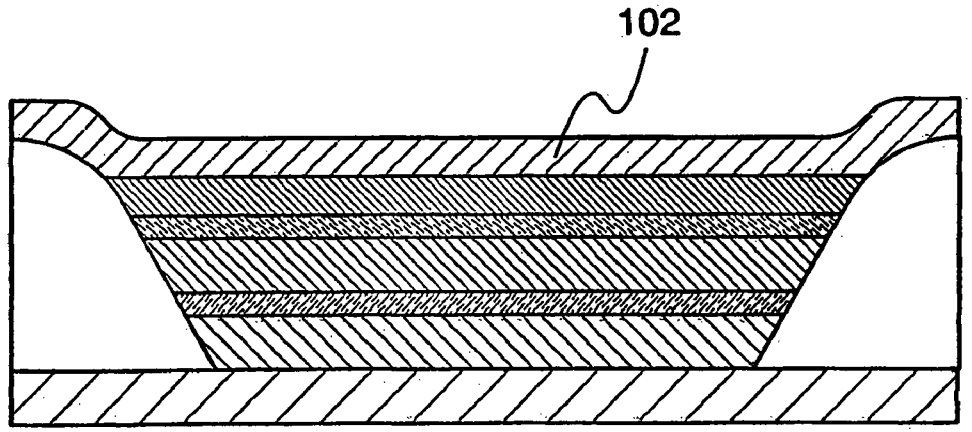

In this embodiment mode, a method for manufacturing a light emitting element of the invention, having a plurality of layers between a first electrode 101 and a second electrode 102 as shown in FIG. 1, is explained with reference to FIGS. 2A to 2D and 3A to 3C. Although five layers of a first layer 111, a second layer 112, a third layer 113, a fourth layer 114, and a fifth layer 115 are laminated in FIG. 1, the number of laminated layers is not particularly limited.

A barrier layer 121 provided with an opening so as to expose a part of the first electrode 101 is formed over the first electrode 101.

Here, the first electrode 101 is not particularly limited and may be formed from a conductive material such as aluminum (Al), gold (Au), platinum (Pt), nickel (Ni), tungsten (W), chromium (Cr), molybdenum (Mo), iron (Fe), cobalt (Co), copper (Cu), or palladium (Pd) as well as indium tin oxide, indium tin oxide containing silicon oxide, or indium oxide containing zinc oxide of 2% to 20%. The barrier layer 121 is also not particularly limited and may be formed from an inorganic material such as silicon oxide, an organic material such as acrylic, polyimide, or a resist, or the like. The barrier layer 121 may alternatively be formed using siloxane or the like.

Subsequently, a first layer 111 containing a compound including a conjugated double bond (first compound) is formed over the first electrode 101. The first compound is preferably a low molecular weight compound which can be easily produced by a [2+2] cycloaddition reaction. Here, the low molecular weight compound means a compound having a molecular weight of 100 to 1000. As such a compound, for example, anthracene, an anthracene derivative, cinnamic acid, a cinnamic acid derivative, a coumarin derivative, or the like can be given.

A method for forming the first layer 111 is not particularly limited. The first layer 111 may be formed by any of methods such as an evaporation method, a coating method, and a drawing method. Here, the drawing method means a method for selectively forming a film in a desired portion while controlling the timing or position of dropping a material solution. Note that, by using the drawing method, a substance that is a material for forming the layer can be used without waste, and a light emitting element can be manufactured with high material-use efficiency.

Subsequently, the first layer 111 is irradiated with light to cause a [2+2] cycloaddition reaction of the first compound. Here, the [2+2] cycloaddition reaction is one kind of photoreactions and means the reaction of compounds each including a conjugated double bond to form a cyclic structure by addition.

By causing a [2+2] cycloaddition reaction of the first compound, a second compound that is a photodimer of the first compound is produced. When the first compound is, for example, anthracene, a photodimer of anthracene is produced as the second compound by light irradiation. In this manner, a second layer 112 containing the second compound is formed.

A light irradiation method or the like is not particularly limited. The wavelength, irradiation time, irradiation intensity, or the like of irradiation light may be adjusted in accordance with characteristics of the first compound so as to cause a [2+2] cycloaddition reaction. Further, there is no particular limitation on how deep from the surface (surface on a light entering side) in a thickness direction a region in the first layer 111 is changed to the second layer 112.

The second layer 112 formed as described above is a layer having lower solubility in a solvent, particularly, an organic solvent than the first layer 111.

Subsequently, a third layer 113 containing a compound including a conjugated double bond (third compound) is formed over the second layer 112. The third compound is preferably a low molecular weight compound which can be easily produced by a [2+2] cycloaddition reaction, and a similar compound to the first compound can be used.

A method for manufacturing the third layer 113 is not particularly limited. The third layer 113 may be formed by any of methods such as an evaporation method, a coating method, and a drawing method. Since the second layer 112 is hard to dissolve in a solvent, particularly, an organic solvent, a layer can be easily formed over the second layer 112 not only by a dry method such as an evaporation method but also by a wet method such as a coating method or a drawing method using a solution containing a solvent, particularly, an organic solvent as a material. By using the drawing method, a substance that is a material for forming the layer can be used without waste, and a light emitting element can be manufactured with high material-use efficiency.

Then, the third layer 113 is irradiated with light to cause a [2+2] cycloaddition reaction of the third compound. By causing a [2+2] cycloaddition reaction of the third compound, a fourth compound that is a dimer of the third compound is produced. In this manner, a fourth layer 114 containing the fourth compound is formed.

A light irradiation method or the like is not particularly limited. The wavelength, irradiation time, irradiation intensity, or the like of irradiation light may be adjusted in accordance with characteristics of the third compound to cause a [2+2] cycloaddition reaction. Further, there is no particular limitation on how deep from the surface (surface on a light entering side) in a thickness direction a region in the third layer 113 is changed to the fourth layer 114.

Next, a fifth layer 115 is formed over the fourth layer 114. A method for forming the fifth layer 115 is not particularly limited. The fifth layer 115 may be formed by any of methods such as an evaporation method, a coating method, and a drawing method. Since the fourth layer 114 is a layer formed of the fourth compound produced by a [2+2] cycloaddition reaction, a layer can be easily formed over the fourth layer 114 not only by a dry method such as an evaporation method but also by a wet method such as a coating method or a drawing method. By using the drawing method, a substance that is a material for forming the layer can be used without waste, and a light emitting element can be manufactured with high material-use efficiency. The fifth layer 115 may be formed using a high molecular weight compound as well as a low molecular weight compound. Here, the high molecular weight compound is a compound having a synchronization structure within a molecule and having a distribution in molecular weight. When a layer containing a substance produced by a [2+2] cycloaddition reaction need not particularly be provided, the fifth layer 115 may be formed using a high molecular weight compound as well as a low molecular weight compound as described above. However, when a low molecular weight compound is used, a light emitting element, which does not contain an impurity such as a polymerization initiator, can be obtained.

By providing the second layer 112 or the fourth layer 114 containing a compound produced by a [2+2] cycloaddition reaction as described above, it becomes easy to form the third layer 113 or the fifth layer 115 by a wet method. Thus, the light emitting element of the invention can be easily manufactured by a wet method; therefore, it can be manufactured at low cost by forming a film particularly using a drawing method. Note that an inkjet method or the like can be given as a specific example of the drawing method.

Subsequently, a second electrode 102 is formed over the fifth layer 115. Here, the second electrode 102 is not particularly limited and may be formed from a conductive material such as aluminum (Al), gold (Au), platinum (Pt), nickel (Ni), tungsten (W), chromium (Cr), molybdenum (Mo), iron (Fe), cobalt (Co), copper (Cu), or palladium (Pd) as well as indium tin oxide, indium tin oxide containing silicon oxide, indium oxide containing zinc oxide of 2% to 20%. Note that either or both the first electrode 101 and the second electrode 102 are preferably formed from a conductive material which can transmit visible light. This makes it possible to extract emitted light through either or both electrodes.

In this embodiment mode, treatment for causing a [2+2] cycloaddition reaction is performed on the two layers, the first layer 111 and the third layer 113. However, such treatment need not be performed on all layers formed by a film forming method such as an evaporation method, a coating method, or a drawing method. For example, when the third compound is insoluble in the solvent included in the fifth layer 115, treatment for causing a [2+2] cycloaddition reaction may be performed only on the first layer 111 because the fourth layer 114 need not necessarily be formed.

When voltage is applied to the first electrode 101 and the second electrode 102 and a current flows therebetween, an electron and a hole are recombined to excite a light emitting substance. The excited light emitting substance emits light when returning to a ground state. There is no particular limitation on in which layer a light emitting substance is included. In such a light emitting element as shown in FIG. 1, a light emitting substance is preferably included in the third layer 113 which is away from both electrodes. This can prevent quenching due to metal. Here, the light emitting substance is a substance that has favorable luminous efficiency and can emit light of a desired emission wavelength. Therefore, when the third compound can react by [2+2] cycloaddition and has favorable luminous efficiency, the third compound may be used as the light emitting substance. When a different material from the third compound is made to emit light, a substance which can emit light of a desired emission wavelength may be mixed together with the third compound. There is no particular limitation on the light emitting substance, and a phosphorescent substance or the like as well as a fluorescent substance can be used. The thickness, carrier transport properties, or the like of the first layer 111, the second layer 112, the fourth layer 114, and the fifth layer 115 may be adjusted so as to recombine an electron and a hole in the third layer 113. In addition, a layer containing alkali metal or alkaline earth metal such as lithium fluoride, calcium fluoride, lithium, or calcium, may be provided to be in contact with one of the two electrodes, which serves as a cathode, in order to assist electron injection. In addition, a layer containing metal oxide such as molybdenum oxide or vanadium oxide, or the like may be provided to be in contact with the other electrode which serves as an anode in order to assist hole injection.

A light emitting element, in which a plurality of layers formed by a wet method is laminated, can be easily manufactured by carrying out the above-described method for manufacturing the light emitting element of the invention. It can also be manufactured at low cost when manufactured particularly using a drawing method among a wet method. Further, by employing the method for manufacturing a light emitting element of the invention, a light emitting element, which does not contain an impurity such as a polymerization initiator, can be manufactured.

Embodiment Mode 2

In this embodiment mode, a semiconductor element to which the invention is applied is explained with reference to FIG. 10.

Figure 10:
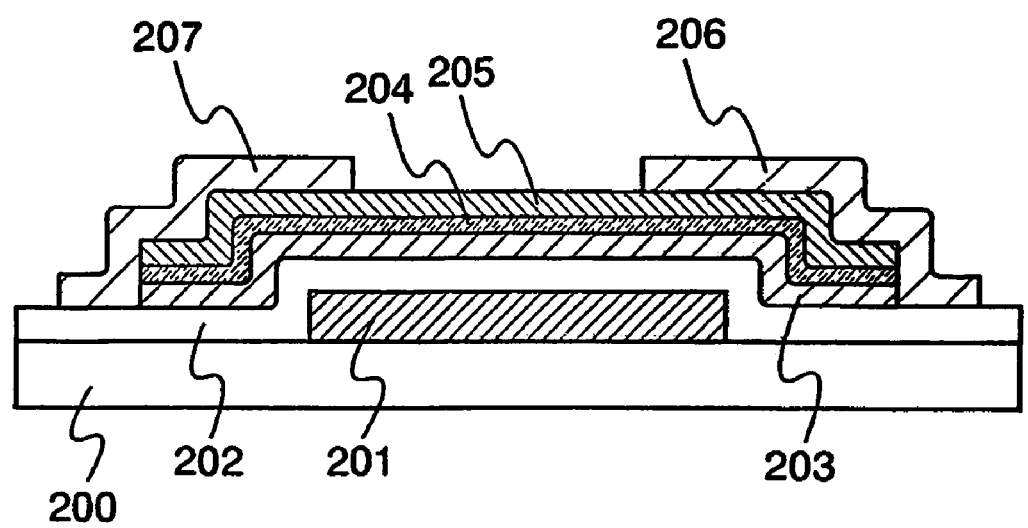
FIG. 10 shows a semiconductor device of the present invention.

In FIG. 10, a gate insulating layer 202 is provided to cover a gate electrode 201 over a support 200. The gate electrode 201 is not particularly limited, and can be formed using a conductive material such as aluminum, copper, gold, or silver. The gate insulating layer 202 is also not particularly limited, and may be formed of an organic material as well as an inorganic material such as silicon oxide or silicon nitride. Further, the support 200 is not particularly limited, and a flexible substrate such as a plastic substrate as well as a glass substrate, a quartz substrate, or the like may be used.

A first semiconductor layer 203 is provided over the gate insulating layer 202 to overlap the gate electrode 201 and the gate insulating layer 202. The first semiconductor layer 203 is a layer containing a compound including a conjugated double bond (fifth compound). The fifth compound is preferably a low molecular weight compound which can be easily produced by a [2+2] cycloaddition reaction. Here, the low molecular weight compound means a compound having a molecular weight of 100 to 1000. For example, anthracene, an anthracene derivative, cinnamic acid, a cinnamic acid derivative, a coumarin derivative, a pentacene derivative, or the like can be given as such a compound.

A method for forming the first semiconductor layer 203 is not particularly limited. The first semiconductor layer 203 may be formed by any of methods such as an evaporation method, a coating method, and a drawing method. Note that, by using the drawing method, a substance that is a material for forming the layer can be used without waste, and a transistor can be manufactured with high material-use efficiency.

The transistor in FIG. 10 has a second semiconductor layer 204 in contact with the first semiconductor layer 203. The second semiconductor layer 204 is a layer containing a dimer of the fifth compound (sixth compound) produced by irradiating the first semiconductor layer 203 with light and causing a [2+2] cycloaddition reaction. The second semiconductor layer 204 formed in this manner has the property of being hard to dissolve in a solvent, particularly, an organic solvent.

A third semiconductor layer 205 is further provided over the second semiconductor layer 204. A method for forming the third semiconductor layer 205 is not particularly limited. The third semiconductor layer 205 may be formed by any of methods such as an evaporation method, a coating method, and a drawing method. Since the second semiconductor layer 204 is hard to dissolve in a solvent, particularly, an organic solvent, a layer can be easily formed over the second semiconductor layer 204 not only by a dry method such as an evaporation method but also by a wet method such as a coating method or a drawing method using a solution containing a solvent, particularly, an organic solvent as a material. By using the drawing method, a substance that is a material for forming the layer can be used without waste, and a transistor can be manufactured with high material-use efficiency.

The first semiconductor layer 203 or the third semiconductor layer 205 can be formed using a low molecular weight compound or a high molecular weight compound such as pentacene or polythiophene.

Here, one of the first semiconductor layer 203 and the third semiconductor layer 205 is formed with an n-type semiconductor (a semiconductor in which the mobility of an electron is higher than that of a hole and an electron is preferentially transported), and the other is formed with a p-type semiconductor (a semiconductor in which the mobility of a hole is higher than that of an electron and a hole is preferentially transported). In other words, the polarity of a preferentially transported carrier differs between the first semiconductor layer 203 and the third semiconductor layer 205.

A source electrode 206 and a drain electrode 207 are provided over the third semiconductor layer 205. The source electrode 206 and the drain electrode 207 are not particularly limited, and may be formed using a conductive organic material formed with a poly(ethylenedioxythiophene)/poly(styrenesulfonate) water solution (PEDOT/PSS) or the like as well as aluminum, copper, gold, silver, or the like. A method for forming the source electrode 206 and the drain electrode 207 is not particularly limited. The source electrode 206 and the drain electrode 207 may be formed by any of methods such as an evaporation method, a coating method, and a drawing method. In the case of using a wet method such as an application method or a drawing method, a layer which is hard to dissolve in a solvent, particularly, an organic solvent may be formed by irradiating the third semiconductor layer 205 and causing a [2+2] cycloaddition reaction.

In the above-described transistor of the invention, voltage is applied so as to make a potential difference between the source electrode 206 and the drain electrode 207, and positive voltage is applied to the gate electrode 201. Then, a channel is formed in the layer containing an n-type semiconductor and current flows therethrough. Voltage is applied so as to make a potential difference between the source electrode 206 and the drain electrode 207, and negative voltage is applied to the gate electrode 201. Then, a channel is formed in the layer including a p-type semiconductor and current flows therethrough. Specifically, in the case where the first semiconductor layer is formed with an n-type semiconductor and the third semiconductor layer is formed with a p-type semiconductor, a channel is formed in the first semiconductor layer 203 when positive voltage is applied to the gate electrode 201. In addition, a channel is formed in the third semiconductor layer 205 when negative voltage is applied to the gate electrode 201.

A light emitting element, in which a plurality of layers formed by a wet method is laminated, can be easily manufactured by carrying out the above-described method for manufacturing the semiconductor element of the invention. It can also be manufactured at low cost particularly when manufactured using a drawing method among a wet method. Note that the structure of the semiconductor element is not limited to that shown in FIG. 10, and a structure different from FIG. 10 may also be used.

Embodiment Mode 3

Since the light emitting element of the invention can be manufactured at low cost, an inexpensive light emitting device, semiconductor device, or the like can be manufactured by using the light emitting element of the invention as a pixel or the like. In addition, a light emitting device with few defects in the light emitting element due to an impurity such as a polymerization initiator can be obtained by carrying out the invention.

In this embodiment mode, a circuit structure and a driving method of a light emitting device including the light emitting element of the invention and having a display function are described with reference to FIGS. 4 to 7.

Figure 4:
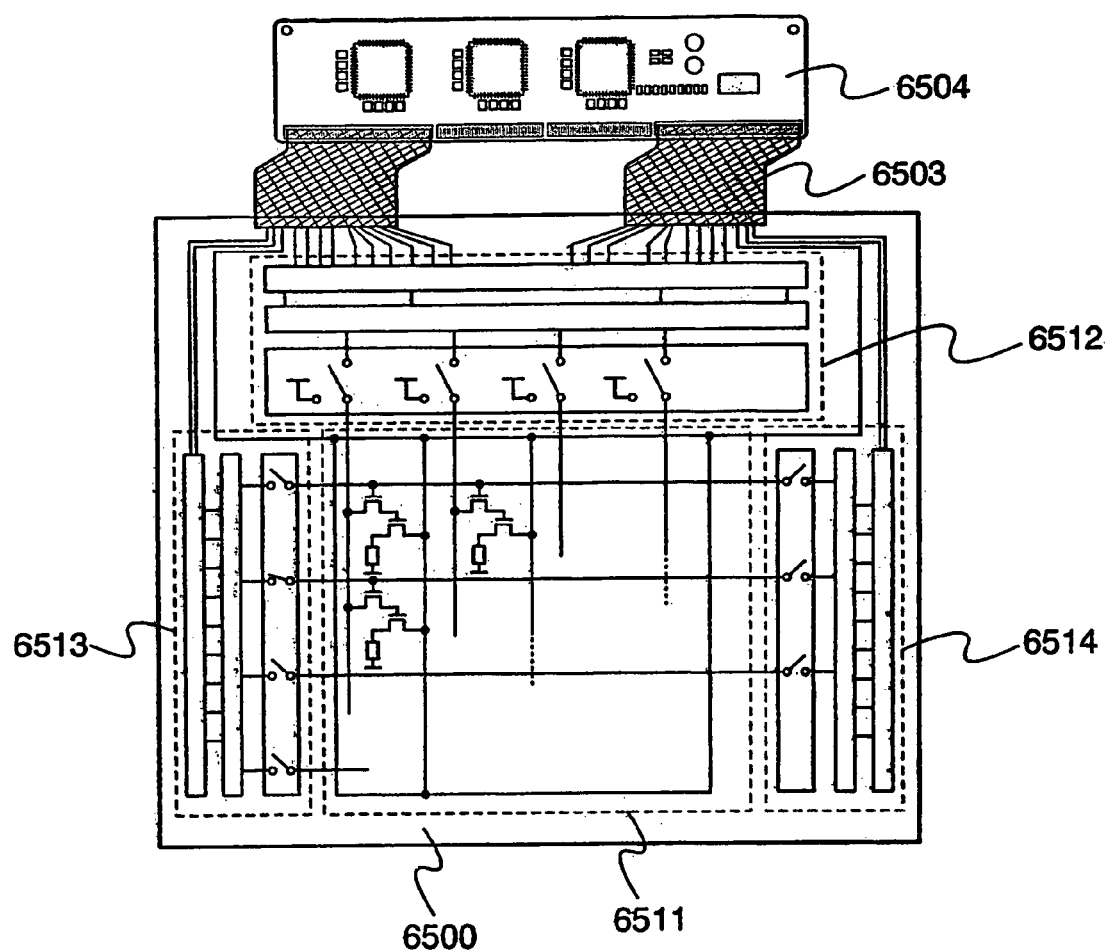
FIG. 4 shows a light emitting device to which the present invention is applied.

FIG. 4 is a schematic top view of a light emitting device to which the invention is applied. In FIG. 4, a pixel portion 6511, a source signal line driver circuit 6512, a write gate signal line driver circuit 6513, and an erase gate signal line driver circuit 6514 are provided over a substrate 6500. Each of the source signal line driver circuit 6512, the write gate signal line driver circuit 6513, and the erase gate signal line driver circuit 6514 is connected to a flexible printed circuit (FPC) 6503, which is an external input terminal, through a wiring group. Each of the source signal line driver circuit 6512, the write gate signal line driver circuit 6513, and the erase gate signal line driver circuit 6514 receives a video signal, a clock signal, a start signal, a reset signal, or the like from the FPC 6503. The FPC 6503 is provided with a printed wiring board (PWB) 6504. Note that a driver circuit portion need not necessarily be provided over the same substrate as the pixel portion 6511 as described above, and may be provided outside of the substrate by using, for example, an IC chip mounted on an FPC which is provided with a wiring pattern (TCP) or the like.

In the pixel portion 6511, a plurality of source signal lines extending in a column direction is arranged in a row direction. A current supply line is also arranged in a row direction. In addition, a plurality of gate signal lines extending in a row direction is arranged in a column direction in the pixel portion 6511. Further, plural sets of circuits each including a light emitting element are arranged in the pixel portion 6511.

Figure 5:
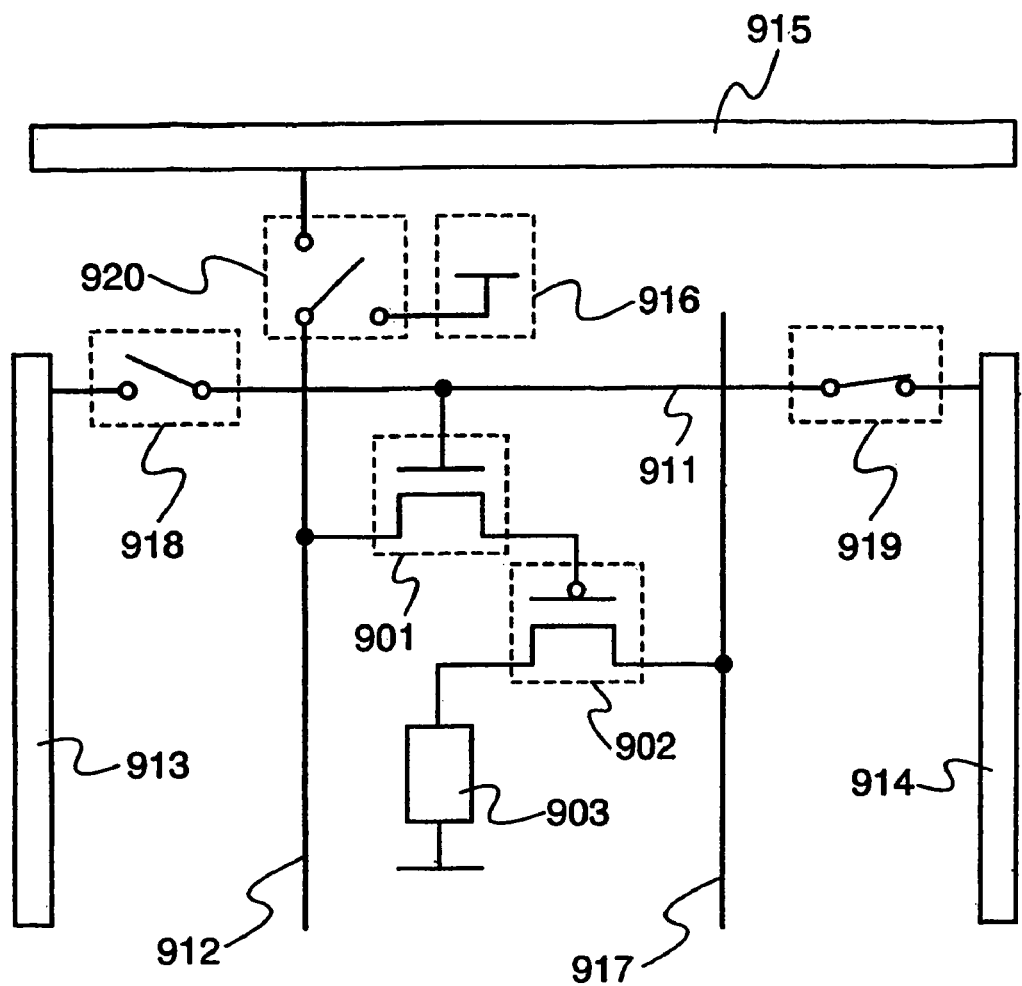
FIG. 5 shows a circuit included in a light emitting device to which the present invention is applied.

FIG. 5 shows a circuit for operating one pixel. The circuit shown in FIG. 5 includes a first transistor 901, a second transistor 902, and a light emitting element 903.

Each of the first transistor 901 and the second transistor 902 is a three-terminal element including a gate electrode, a drain region, and a source region, and includes a channel region between the drain region and the source region. The source region and the drain region are switched depending on a structure or an operating condition of the transistor, or the like; thus, it is difficult to determine which is the source region or the drain region. Therefore, in this embodiment mode, regions each serving as a source or a drain are referred to as a first electrode and a second electrode.

A gate signal line 911 and a write gate signal line driver circuit 913 are provided to be electrically connected or not to be electrically connected with each other via a switch 918. The gate signal line 911 and an erase gate signal line driver circuit 914 are provided to be electrically connected or not to be electrically connected with each other via a switch 919. A source signal line 912 is provided to be electrically connected to either a source signal line driver circuit 915 or a power source 916 via a switch 920. The gate of the first transistor 901 is electrically connected to the gate signal line 911. The first electrode of the first transistor 901 is electrically connected to the source signal line 912, and the second electrode of the first transistor 901 is electrically connected to the gate electrode of the second transistor 902. The first electrode of the second transistor 902 is electrically connected to a current supply line 917, and the second electrode of the second transistor 902 is electrically connected to one electrode included in the light-emitting element 903. The switch 918 may be included in the write gate signal line driver circuit 913. Further, the switch 919 may be included in the erase gate signal line driver circuit 914. Moreover, the switch 920 may be included in the source signal line driver circuit 915.

Figure 6:
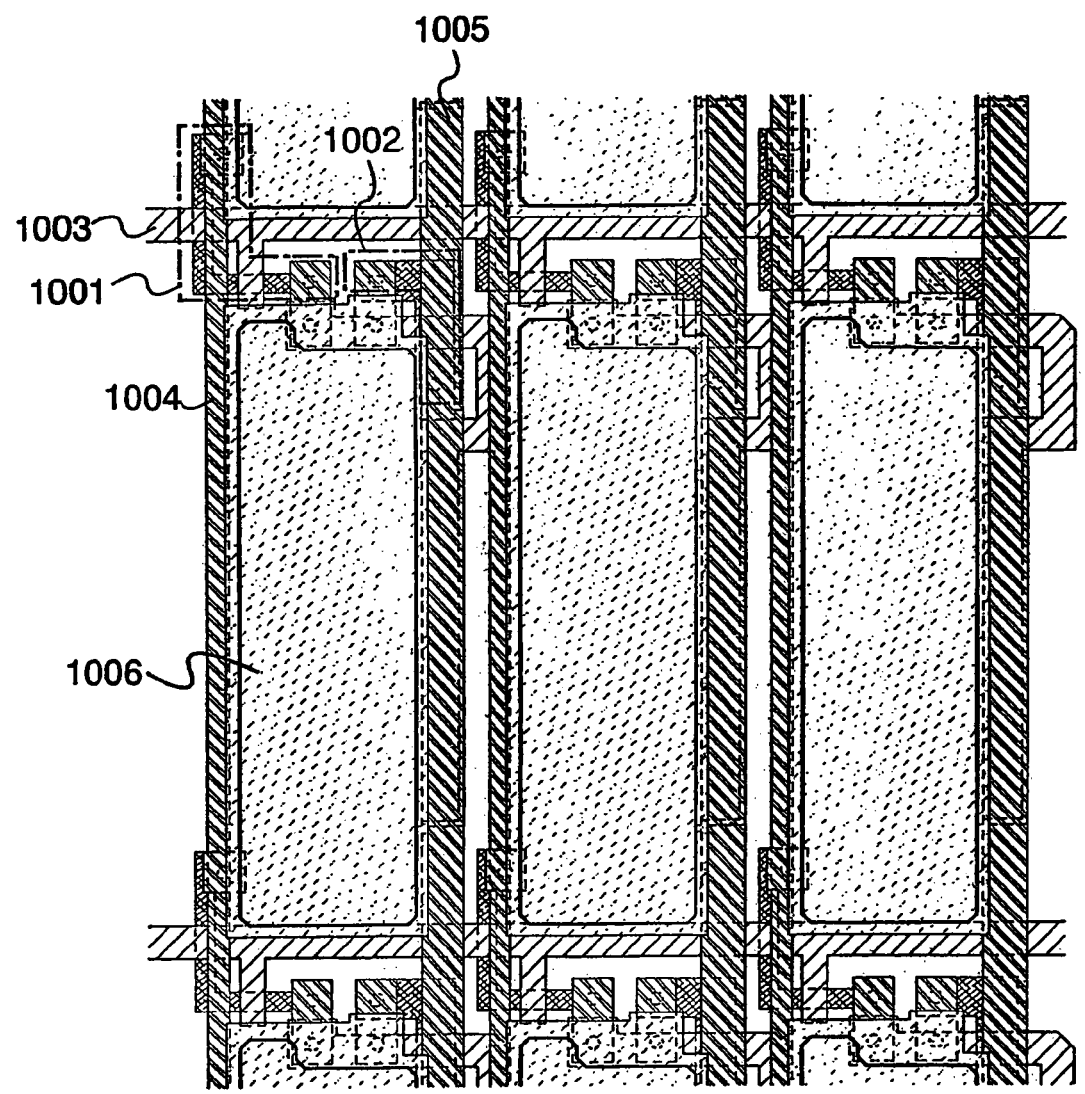
FIG. 6 is a top view of a light emitting device to which the present invention is applied.

The arrangement of the transistor, the light emitting element, and the like in the pixel portion is not particularly limited. For example, the elements can be arranged as shown in a top view of FIG. 6. In FIG. 6, a first electrode of a first transistor 1001 is connected to a source signal line 1004, and a second electrode of the first transistor 1001 is connected to a gate electrode of a second transistor 1002. A first electrode of the second transistor 1002 is connected to a current supply line 1005, and a second electrode of the second transistor is connected to an electrode 1006 of a light emitting element. A part of a gate signal line 1003 serves as a gate electrode of the first transistor 1001.

Figure 7:
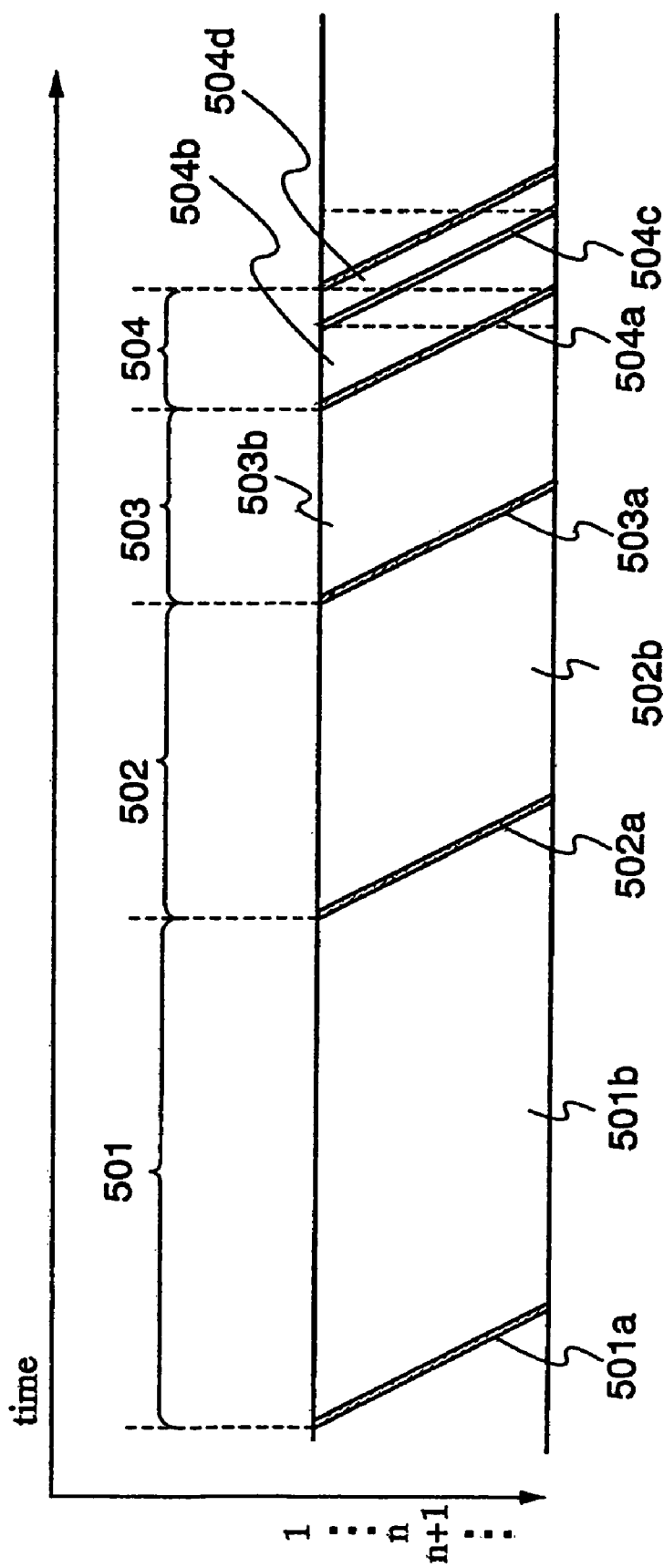
FIG. 7 shows frame operation of a light emitting device to which the present invention is applied.

Next, a driving method is explained. FIG. 7 is an explanatory view of an operation of a frame with time. In FIG. 7, the abscissa-axis direction represents time passage, whereas the ordinate-axis direction represents scanning stages of a gate signal line.

When an image is displayed with a light emitting device of the invention, a rewriting operation and a displaying operation are repeatedly carried out in a display period. The number of rewriting operations is not particularly limited; however, the rewriting operation is preferably performed approximately sixty times per second so that a person who watches the image does not realize flickering. Herein, the period for performing the rewriting and displaying operations of one image (one frame) is referred to as a one frame period.

The one frame period is divided into four subframe periods 501, 502, 503, and 504 including writing periods 501a, 502a, 503a, and 504a, and retention periods 501b, 502b, 503b, and 504b. A light-emitting element provided with a light-emission signal emits light in the retention period. The length ratio of the retention periods in the first subframe period 501, the second subframe period 502, the third subframe period 503, and the fourth subframe period 504 is $2^3:2^2:2^1:2^0=8:4:2:1$. Accordingly, a 4-bit gray scale can be realized. The number of bits or gray scale levels is not limited thereto. For instance, an 8-bit gray scale can be achieved by providing eight subframe periods.

An operation in the one frame period is explained. First, a writing operation is carried out sequentially from the first row to the last row in the subframe period 501. Therefore, the starting time of a writing period differs depending on the rows. The retention period 501b starts in the row where the writing period 501a is completed. In the retention period, a light emitting element provided with a light emission signal emits light. The subframe period 502 starts in the row where the retention period 501b is completed, and a writing operation is carried out sequentially from the first row to the last row as is the case with the subframe period 501. Operations as noted above are repeatedly carried out until the retention period 504b of the subframe period 504 is completed. When the operation in the subframe period 504 is completed, an operation in the next frame period is started. The sum of light emitting time in each subframe period is light emitting time of each light emitting element in the one frame period. By changing the emitting time for each light emitting element and variously combining in one pixel, various colors can be displayed with different brightness and chromaticity.

When a retention period in the row where writing has been finished and the retention period has started is intended to be forcibly terminated before finishing the writing of the last row, like in the subframe period 504, preferably an erasing period 504c is provided after the retention period 504b to control the operations so that the light emission is forcibly stopped. In the row where the light-emission is forcibly stopped, the light emitting element does not emit light for a certain period (the period is referred to as a non-light emission period 504d). Upon finishing the writing period of the last row, the next writing period (or frame period) starts sequentially from the first row. This can prevent the writing period of the subframe period 504 from overlapping the writing period of the next subframe period.

In this embodiment mode, the subframe periods 501 to 504 are arranged to coincide in the order of decreasing retention periods; however, the present invention is not limited thereto. For instance, the subframe periods 501 to 504 may be arranged to coincide in the order of increasing retention periods. The subframe periods 501 to 504 may be arranged at random, mixing a short subframe period and a long subframe period. The subframe period may be further divided into a plurality of frame periods. In other words, scanning of the gate signal line can be carried out a plurality of times during the period of giving the same video signal.

An operation of the circuit shown in FIG. 5 in a writing period and an erasing period is explained.

First, an operation in the writing period is explained. In the writing period, the gate signal line 911 in the n-th row (n is a natural number) is electrically connected to the write gate signal line driver circuit 913 via the switch 918, and is not connected to the erase gate signal line driver circuit 914. The source signal line 912 is electrically connected to the source signal line driver circuit 915 via the switch 920. A signal is inputted to the gate of the first transistor 901 connected to the gate signal line 911 in the n-th row, and the first transistor 901 is turned ON. At this time, video signals are simultaneously inputted to the source signal lines in the first column to the last column. Video signals inputted from the source signal line 912 at each column are independent of each other. The video signal inputted from the source signal line 912 is inputted to the gate electrode of the second transistor 902 via the first transistor 901 connected to each source signal line. At this time, a current value to be supplied from the current supply line 917 to the light emitting element 903 is determined depending on a signal inputted to the second transistor 902. Then, emission or non-emission of the light-emitting element 903 is determined depending on the current value. For example, in the case where the second transistor 902 is a p-channel type, the light emitting element 903 emits light when a Low Level signal is inputted to the gate electrode of the second transistor 902. On the other hand, in the case where the second transistor 902 is an n-channel type, the light emitting element 903 emits light when a High Level signal is inputted to the gate electrode of the second transistor 902.

Then, an operation in the erasing period is explained. In the erasing period, the gate signal line 911 in the n-th row (n is a natural number) is electrically connected to the erase gate signal line driver circuit 914 via the switch 919, and is not connected to the write gate signal line driver circuit 913. The source signal line 912 is electrically connected to the power source 916 via the switch 920. A signal is inputted to the gate of the first transistor 901 connected to the gate signal line 911 in the n-th row, and the first transistor 901 is turned ON. At this time, erase signals are simultaneously inputted to the source signal lines in the first column to the last column. The erase signal inputted from the source signal line 912 is inputted to the gate electrode of the second transistor 902 via the first transistor 901 connected to each source signal line. By the signal inputted to the second transistor 902, current supply from the current supply line 917 to the light emitting element 903 is stopped. Then, the light emitting element 903 does not emit light forcibly. For example, in the case where the second transistor 902 is a p-channel type, the light emitting element 903 does not emit light when a High Level signal is inputted to the gate electrode of the second transistor 902. On the other hand, in the case where the second transistor 902 is an n-channel type, the light emitting element 903 does not emit light when a Low Level signal is inputted to the gate electrode of the second transistor 902.

In the erasing period, a signal for erasing is inputted to the n-th row (n is a natural number) by the operation as described above. However, as described above, there is a case that the n-th row is in an erasing period and another row (the m-th row (m is a natural number) in this instance) is in a writing period. In this case, it is required that a signal for erasing is inputted to the n-th row and a signal for writing is inputted to the m-th row by utilizing a source signal line of the same column. Accordingly, an operation to be explained as follows is preferably carried out.

Immediately after the light emitting element 903 in the n-th row is brought into a non emission state by the operation in the erasing period described above, the gate signal line is disconnected from the erase gate signal line driver circuit 914, and the source signal line is connected to the source signal line driver circuit 915 by operating the switch 920. In addition to connecting the source signal line to the source signal line driver circuit 915, the gate signal line is connected to the write gate signal line driver circuit 913. A signal is selectively inputted to the signal line in the m-th row from the write gate signal line driver circuit 913, and the first transistor is turned ON. In addition, signals for writing are inputted to the source signal lines in the first column to the last column from the source signal line driver circuit 915. The light emitting element in the m-th row emits light or no light depending on the signal.

Upon finishing the writing period of the m-th row as noted above, an erasing period in the (n+1)-th row starts. Hence, the gate signal line is disconnected from the write gate signal line driver circuit 913, and the source signal line is connected to the power source 916 by operating the switch 920. Further, the gate signal line is disconnected from the write gate signal line driver circuit 913, and the gate signal line is connected to the erase gate signal line driver circuit 914. When a signal is selectively inputted to the gate signal line in the (n+1)-th row from the erase gate signal line driver circuit 914 and the first transistor is turned ON, an erase signal is inputted from the power source 916. Upon finishing the erasing period of the (n+1)-th row, a writing period in the m-th row starts. Hereinafter, in the similar manner, an erasing period and a writing period may be carried out repeatedly to operate to an erasing period of the last row.

In this embodiment mode, a mode in which the writing period of the m-th row is provided between the erasing period of the n-th row and the erasing period of the (n+1)-th row is explained. Without being limited thereto, however, the writing period of the m-th row may be provided between the erasing period of the (n−1)-th row and the erasing period of the n-th row.

In this embodiment mode, when the non-light emission period 504d is provided as in the subframe period 504, an operation of disconnecting the erase gate signal line driver circuit 914 from a certain gate signal line and connecting the write gate signal line driver circuit 913 to another gate signal line is repeatedly carried out. Such an operation may be carried out in a frame period that is not provided with a non-light emission period.

Embodiment Mode 4

An example of a cross-sectional view of a light emitting device including an electronic device of the invention is explained with reference to FIGS. 8A to 8C.

Figure 8A:
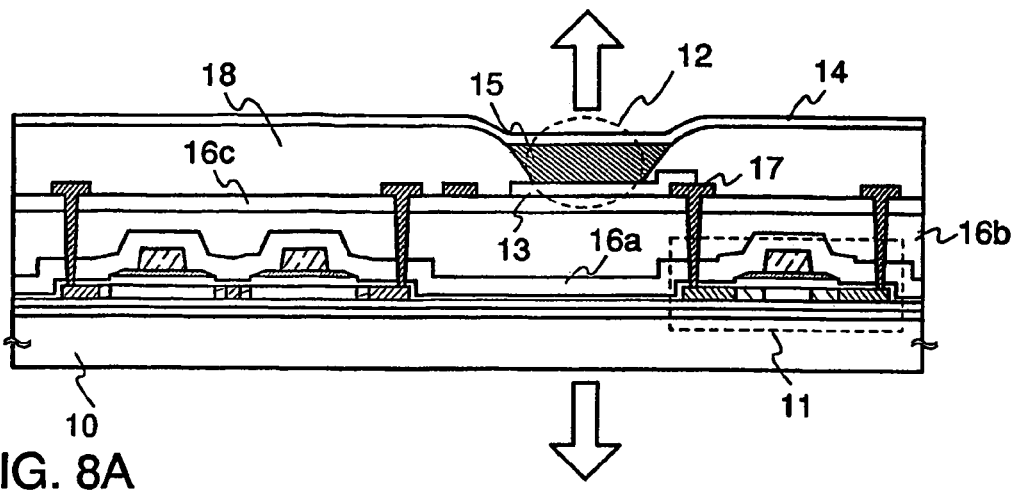
FIGS. 8A to 8C are cross-sectional views of a light emitting device to which the present invention is applied.
Figure 8B:
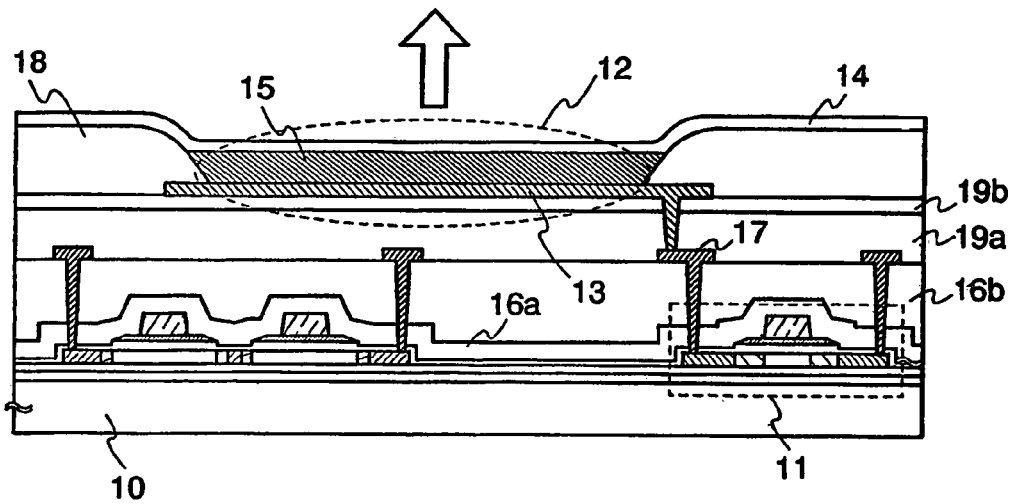
Figure 8C:
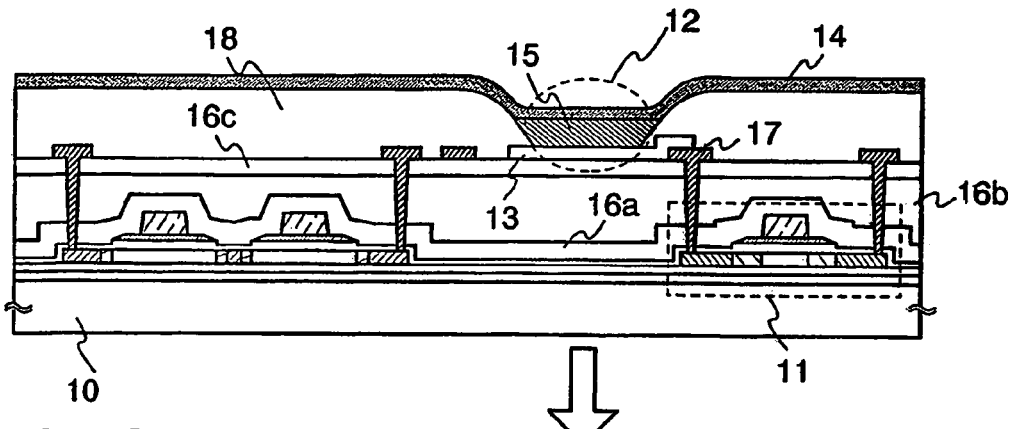

In FIGS. 8A to 8C, a portion surrounded by dotted lines is a transistor 11 which is provided to drive a light emitting element 12 of the invention. The light emitting element 12 is the light emitting element of the invention having a layer 15 in which a plurality of layers is laminated between a first electrode 13 and a second electrode 14 as described in Embodiment Mode 1. A drain of the transistor 11 is electrically connected to the first electrode 13 by a wiring 17 penetrating a first interlayer insulating film 16 (16a, 16b, and 16c). The light emitting element 12 is separated from another adjacently provided light emitting element by a barrier layer 18. The light emitting device of the invention having a structure such as this is provided over a substrate 10 in this embodiment mode.

Note that each of the transistors 11 shown in FIGS. 8A to 8C is a top gate type in which a gate electrode is provided opposite to a substrate, with a semiconductor layer interposed therebetween. However, there is no particular limitation on the structure of the transistor 11; for example, a bottom gate type may be used. In the case of a bottom gate type, the transistor 11 may have a structure in which a protective film is formed over the semiconductor layer to be provided with a channel (a channel protective type) or a structure in which a part of the semiconductor layer to be provided with a channel has a depression (a channel etch type).

Alternatively, the semiconductor layer included in the transistor 11 may be either crystalline or amorphous. Further, it may be semi-amorphous. Still alternatively, it may be a semiconductor layer including a semiconductor formed of an organic material in addition to a semiconductor formed of an inorganic material.

Note that characteristics of the semi-amorphous semiconductor are as follows. It has an intermediate structure between an amorphous structure and a crystalline structure (including a single crystal and a polycrystal) and a third state which is stable in terms of free energy, and it includes a crystalline region having short-range order and lattice distortion. At least a part of a region in the film contains a crystal grain of 0.5 nm to 20 nm. A Raman spectrum is shifted to a lower wavenumber side than 520 cm$^{-1}$. A diffraction peak of (111) or (220) to be caused by a crystal lattice of silicon is observed in X-ray diffraction. Hydrogen or halogen of 1 atomic % or more is included to terminate a dangling bond. It is also referred to as a microcrystal semiconductor. The semi-amorphous semiconductor is formed by performing glow discharge decomposition (plasma CVD) on a silicide gas. $SiH_4$ is given as the silicide gas. In addition, $Si_2H_6$, $SiH_2Cl_2$, $SiHCl_3$, $SiCl_4$, $SiF_4$, or the like can also be used as the silicide gas. The silicide gas may be diluted with $H_2$, or $H_2$ and one or more rare gas elements of helium, argon, krypton, and neon. A dilution ratio thereof may range from 2 times to 1000 times; pressures, approximately 0.1 Pa to 133 Pa; power supply frequency, 1 MHz to 120 MHz, preferably, 13 MHz to 60 MHz. A substrate heating temperature may be 300° C. or less, preferably, 100° C. to 250° C. An impurity concentration of an atmospheric constituent impurity such as oxygen, nitrogen, or carbon, as an impurity element in the film, is preferably $1\times10^{20}$/cm$^3$ or less; specifically, a concentration of oxygen is $5\times10^{19}$/cm$^3$ or less, preferably $1\times10^{19}$/cm$^3$ or less. Note that the mobility of a TFT (thin film transistor) using the semi-amorphous semiconductor is approximately 1 cm$^2$/Vsec to 10 cm$^2$/Vsec.

As a specific example of the crystalline semiconductor layer, a layer formed of single-crystal or polycrystalline silicon, silicon germanium, or the like can be given. It may be formed by laser crystallization or may be formed by crystallization through a solid phase growth method using, for example, nickel.

When the semiconductor layer is formed of an amorphous substance, for example, amorphous silicon, a light emitting device preferably has a circuit in which the transistor 11 and all other transistors (transistors included in a circuit for driving a light emitting element) are all n-channel transistors. Other than that, a light emitting device may have a circuit including either n-channel transistors or p-channel transistors, or a light emitting device may have a circuit including both types of transistors.

The first interlayer insulating film 16 may have a multilayer structure as shown in FIGS. 8A to 8C, or a single-layer structure. Note that the interlayer insulating film 16a is made from an inorganic material such as silicon oxide or silicon nitride; the interlayer insulating film 16b is made from acrylic, siloxane (a compound having a skeleton formed from a bond of silicon (Si) and oxygen (O) and has a substituent of an alkyl group or the like), or a self-planarizing substance which can form a film by coating, such as silicon oxide. In addition, the interlayer insulating film 16c is made from a silicon nitride film containing argon (Ar). Note that there is no particular limitation on materials forming each layer, and a material other than the foregoing materials can also be used. A layer made from a material other than the foregoing materials may also be combined. As described above, the first interlayer insulating film 16 may be formed with either an inorganic material or an organic material, or both of them.

The barrier layer 18 preferably has a shape in an edge portion, in which a curvature radius changes continuously. In addition, the barrier layer 18 is formed with acrylic, siloxane, a resist, silicon oxide, or the like. Note that the barrier layer 18 may be formed with either an inorganic material or an organic material, or both of them.

In FIGS. 8A and 8C, only the first interlayer insulating film 16 is provided between the transistor 11 and the light emitting element 12. However, as shown in FIG. 8B, a second interlayer insulating film 19 (19a and 19b) may also be provided in addition to the first interlayer insulating film 16 (16a and 16b). In the light emitting device shown in FIG. 8B, the first electrode 13 penetrates the second interlayer insulating film 19 and connects to the wiring 17.

The second interlayer insulating film 19 may have a multilayer structure or a single-layer structure like the first interlayer insulating film 16. The second interlayer insulating film 19a is made from acrylic, siloxane, or a self-planarizing substance which can form a film by coating, such as silicon oxide. The second interlayer insulating film 19b is formed with a silicon nitride film containing argon (Ar). Note that there is no particular limitation on materials forming each layer, and a material other than the foregoing materials can also be used. A layer made from a material other than the foregoing materials may also be combined. As described above, the second interlayer insulating film 19 may be formed with either an inorganic material or an organic material, or both of them.

When both the first electrode 13 and the second electrode 14 are formed from a light transmitting material in the light emitting element 12, light emission can be extracted through both the first electrode 13 and the second electrode 14 as indicated by the outlined arrow in FIG. 8A. When only the second electrode 14 is formed from a light transmitting material, light emission can be extracted only through the second electrode 14 as indicated by the outlined arrow in FIG. 8B. In this case, it is preferable to form the first electrode 13 from a highly reflective material or provide a film formed from a highly reflective material (reflective film) below the first electrode 13. When only the first electrode 13 is formed from a light transmitting material, light emission can be extracted only through the first electrode 13 as indicated by the outlined arrow in FIG. 8C. In this case, it is preferable to form the second electrode 14 from a highly reflective material or provide a reflective film above the second electrode 14.

In the light emitting element 12, the layer 15 may have such a laminated structure as to operate the light emitting element 12 when voltage is applied so that a potential of the second electrode 14 becomes higher than that of the first electrode 13, or the layer 15 may have such a laminated structure as to operate the light emitting element 12 when voltage is applied so that a potential of the second electrode 14 becomes lower than that of the first electrode 13. In the former case, the transistor 11 is an n-channel transistor, and in the latter case, the transistor 11 is a p-channel transistor.

As described above, an active light emitting device in which drive of the light emitting element is controlled by the transistor is explained in this embodiment mode. However, a passive light emitting device, in which the light emitting element is driven without particularly providing a drive element such as a transistor, may also be used. The passive light emitting device can also be driven with low power consumption when it includes the light emitting element of the invention which operates at low drive voltage.

Embodiment Mode 5

An electronic device can be obtained at low cost by mounting the light emitting device of the invention, since the light emitting device of the invention can be manufactured at low cost.

FIGS. 9A to 9C show embodiments of an electronic device mounted with the light emitting device to which the invention is applied.

FIG. 9A shows a notebook personal computer manufactured by applying the invention, which includes a main body 5521, a chassis 5522, a display portion 5523, a keyboard 5524, or the like. The personal computer can be completed by incorporating a light emitting device having the light emitting element of the invention as a display portion.

FIG. 9B shows a telephone manufactured by applying the invention, which includes a main body 5552, a display portion 5551, an audio output portion 5554, an audio input portion 5555, operation keys 5556 and 5557, an antenna 5553, or the like. The telephone can be completed by incorporating a light emitting device having the light emitting element of the invention as a display portion.

FIG. 9C shows a television set manufactured by applying the invention, which includes a display portion 5531, a chassis 5532, a loudspeaker 5533, or the like. The television set can be completed by incorporating a light emitting device having the light emitting element of the invention as a display portion.

As describe above, the light emitting device of the invention is very suitable for use as a display portion of various electronic devices.

Note that the light emitting device having the light emitting element of the invention may also be mounted on a navigation system, a lighting device, or the like, other than the above-mentioned electronic devices.

EXPLANATION OF REFERENCE

101: First electrode, 102: Second electrode, 111: First layer, 112: Second layer, 113: Third layer, 114: Fourth layer, 115: Fifth layer, 121: Barrier layer, 200: Support, 201: Gate electrode, 202: Gate insulating layer, 203: First semiconductor layer, 204: Second semiconductor layer, 205: Third semiconductor layer, 206: Source electrode, 207: Drain electrode, 6500: Substrate, 6503: Flexible printed circuit (FPC), 6504: Printed circuit board (PWB), 6511: Pixel portion, 6512: Source signal line driver circuit, 6513: Write gate signal line driver circuit, 6514: Erase gate signal line driver circuit, 901: First transistor, 902: Second transistor, 903: Light emitting element, 911: Gate signal line, 912: Source signal line, 913: Write gate signal line driver circuit, 914: Erase gate signal line driver circuit, 915: Source signal line driver circuit, 916: Power source, 917: Current supply line, 918: Switch, 919: Switch, 920: Switch, 1001: First transistor, 1002: Second transistor, 1003: Gate signal line, 1004: Source signal line, 1005: Current supply line, 1006: Electrode, 501: Subframe period, 502: Subframe period, 503: Subframe period, 504: Subframe period, 501*a*: Writing period, 501*b*: Retention period, 502*a*: Writing period, 502*b*: Retention period, 503*a*: Writing period, 503*b*: Retention period, 504*a*: Writing period, 504*b*: Retention period, 504*c*: Erasing period, 564*d*: Non-light emission period, 10: Substrate, 11: Transistor, 12: Light emitting element, 13: First electrode, 14: Second electrode, 15: Layer, 16: Interlayer insulating film, 17: Wiring, 18: Barrier layer, 19: Interlayer insulating film, 5521: Main body, 5522: Chassis, 5523: Display portion, 5524: Keyboard, 5551: Display portion, 5552: Main body, 5553: Antenna, 5554: Audio output portion, 5555: Audio input portion, 5556: Operation key, 5531: Display portion, 5532: Chassis, and 5533: Loudspeaker.

The invention claimed is:

1. A light emitting device comprising:
   a first layer which contains a first compound including a conjugated double bond and having a molecular weight of 100 to 1000; and
   a second layer containing a second compound which is a dimer of the first compound,
   wherein the first layer and the second layer are laminated on each other.

2. The light emitting device according to claim 1, wherein said first compound is selected from the group consisting of anthracene, an anthracene derivative, cinnamic acid, a cinnamic acid derivative, a coumarin derivative and a pentacene derivative.

3. An electronic device having at least the light emitting device according to claim 1, wherein said electronic device is selected from the group consisting of a notebook personal computer, a telephone, a television set, a navigation system and a lighting device.

4. The light emitting device according to claim 1, wherein the dimer is a photodimer.

5. A light emitting device comprising a first layer and a second layer between a first electrode and a second electrode,
   wherein the first layer contains a first compound including a conjugated double bond and having a molecular weight of 100 to 1000,
   wherein the second layer contains a second compound which is a dimer of the first compound, and
   wherein the first layer and the second layer are laminated on each other.

6. The light emitting device according to claim 5, wherein said first compound is selected from the group consisting of anthracene, an anthracene derivative, cinnamic acid, a cinnamic acid derivative, a coumarin derivative and a pentacene derivative.

7. An electronic device having at least the light emitting device according to claim 5, wherein said electronic device is selected from the group consisting of a notebook personal computer, a telephone, a television set, a navigation system and a lighting device.

8. The light emitting device according to claim 5, wherein the dimer is a photodimer.

9. A light emitting device comprising a second semiconductor layer between a first semiconductor layer and a third semiconductor layer,
   wherein the first semiconductor layer contains a first compound including a conjugated double bond and having a molecular weight of 100 to 1000,
   wherein the second semiconductor layer contains a second compound which is a dimer of the first compound,
   wherein polarity of a preferentially transported carrier differs between the third semiconductor layer and the first semiconductor layer, and
   wherein the first semiconductor layer and the second semiconductor layer are laminated on each other.

10. The light emitting device according to claim 9, wherein said first compound is selected from the group consisting of anthracene, an anthracene derivative, cinnamic acid, a cinnamic acid derivative, a coumarin derivative and a pentacene derivative.

11. An electronic device having at least the light emitting device according to claim 9, wherein said electronic device is selected from the group consisting of a notebook personal computer, a telephone, a television set, a navigation system and a lighting device.

12. The light emitting device according to claim 9, wherein the dimer is a photodimer.

13. A light emitting device comprising a plurality of arranged light emitting elements,
   wherein at least one of the light emitting elements includes:
   a first layer which contains a first compound including a conjugated double bond and having a molecular weight of 100 to 1000; and
   a second layer containing a second compound which is a dimer of the first compound,
   wherein the first layer and the second layer are laminated on each other.

14. The light emitting device according to claim 13, wherein said first compound is selected from the group consisting of anthracene, an anthracene derivative, cinnamic acid, a cinnamic acid derivative, a coumarin derivative and a pentacene derivative.

15. An electronic device having at least the light emitting device according to claim 13, wherein said electronic device is selected from the group consisting of a notebook personal computer, a telephone, a television set, a navigation system and a lighting device.

16. An electronic device comprising the light emitting device according to claim 13, used for a display portion.

17. The light emitting device according to claim 13, wherein the dimer is a photodimer.

* * * * *